United States Patent
Morimoto et al.

[11] Patent Number: 6,081,272
[45] Date of Patent: Jun. 27, 2000

[54] MERGING DUMMY STRUCTURE REPRESENTATIONS FOR IMPROVED DISTRIBUTION OF ARTIFACTS IN A SEMICONDUCTOR LAYER

[75] Inventors: Seiichi Morimoto, Beaverton; Timothy L. Deeter, Portland, both of Oreg.

[73] Assignee: Intel Corporation, Santa Clara, Calif.

[21] Appl. No.: 08/941,599

[22] Filed: Sep. 30, 1997

[51] Int. Cl.[7] .................................................. G06F 15/00
[52] U.S. Cl. ................................................................ 345/420
[58] Field of Search ........................................ 345/435, 419, 345/420; 437/70–80, 16, 25, 26

[56] References Cited

U.S. PATENT DOCUMENTS

| | | |
|---|---|---|
| 4,961,154 | 10/1990 | Pomerantz et al. ................ 364/522 |
| 5,757,980 | 5/1998 | Sugiura ............................. 382/284 |
| 5,844,570 | 12/1998 | Curtright et al. .................. 345/435 |

*Primary Examiner*—Phu K. Nguyen
*Attorney, Agent, or Firm*—Blakely, Sokoloff, Taylor & Zafman LLP

[57] ABSTRACT

A method for optimally sizing dummy structures in an integrated circuit design is disclosed. Adjacent dummy structures are merged to provide a composite merged dummy structure. Each side of a first dummy structure representation is expanded in a lateral direction by a predetermined distance such that the first dummy structure representation merges with an adjacent second dummy structure representation forming the composite merged dummy structure. The composite merged dummy structure is then examined to determine if it exceeds a predetermined size. If the composite merged dummy structure exceeds the predetermined size, then the composite merged dummy structure is contracted to fit within predetermined perimeters.

26 Claims, 4 Drawing Sheets

MERGING DUMMY STRUCTURE REPRESENTATIONS FOR IMPROVED DISTRIBUTION OF ARTIFACTS IN A SEMICONDUCTOR LAYER

BACKGROUND OF THE INVENTION

1. Field of the Invention

The present invention relates to semiconductor processing and more particularly to a method of forming a planar surface in a semiconductor device.

2. Description of Related Art

As companies push to miniaturize electronic components, the features which make up the transistor and other silicon based devices must also become smaller. Because these devices are often made from photolithography techniques which require focusing of a mask across an entire semiconductor surface, the planarity of the semiconductor surface has become increasingly important. An uneven surface causes portions of the photomask to be out of focus. An uneven surface also makes it difficult to form subsequent layers of semiconductor structures on top.

A major cause of uneven surfaces is the uneven density of semiconductor features across a surface. One method of eliminating gaps or open areas between semiconductor features which causes uneven subsequent layers is to place dummy structures between the semiconductor features. For purposes of this application, dummy structures are not considered to be semiconductor features. Dummy structure is an artifact which typically is the same material as the semiconductor feature and is formed during the same process with the formation of the semiconductor features but the dummy structure usually do not perform active electrical functions. Traditionally, these dummy structures are inserted into medium and low density open spaces between semiconductor features. The dummy structures are small so that they can fit the various gaps between semiconductor features. An approximately 50% density of artifacts including semiconductor feature and dummy structures to unoccupied area is desired.

Areas of very high density do not need dummy structure because semiconductor features already meet the 50% density criteria. Very low density areas with wide open spaces may also be adequately filled by many small dummy structures. However, medium/low density areas have scattered devices which make it difficult to place adequate numbers of dummy structures. A typical definition of medium/low density is that semiconductor features represent approximately 10–30% of the pattern surface area. Very low density areas are defined to be regions in which the density of semiconductor features is less than the density of semiconductor features in medium/low density regions. Device processes limit how close dummy structures can be placed. These limitations which are based on lithographic and process constraints prevent medium/low density areas populated with several small dummy structures from being adequately filled. As a result, the density of dummy structures in these medium/low density areas between semiconductor features is lower than the density of semiconductor features in other areas of a semiconductor layer.

In general, dummy structures are inserted to achieve a structure density as uniform as possible across a device layer. Structure density or distribution is defined as the density of artifacts on a semiconductor surface. Such artifacts include both dummy structures and semiconductor features. In order to create a more uniform total structure distribution, it is desirable to have different sized dummy structures corresponding to different size open regions. Such a method of forming different size dummy structures is described in the following application.

A second limitation on dummy structure size is that planarization processes cannot handle large open areas completely filled with one oversized dummy structure. Oversized dummy structures which create densities significantly exceeding 50% create an alternative polishing planarization problem. In particular, oversized dummy structures create a raised area in subsequent semiconductor layers. Thus, it is also desirable to adjust dummy structure sizes in large open areas to "break-up" oversized dummy structures.

The following invention will disclose a method and apparatus for creating different size dummy structures for use in semiconductor devices while at the same time preventing the formation of oversized dummy structures.

SUMMARY OF THE INVENTION

A method of merging dummy structures is described. Each side of a first dummy structure representation is expanded in a lateral direction by a predetermined distance such that the first dummy structure representation merges with an adjacent second dummy structure representation forming an intermediate merged dummy structure representation.

BRIEF DESCRIPTION OF THE DRAWINGS

The advantages of the present invention will become more readily apparent to those ordinarily skilled in the art after reviewing the following detailed description and accompanying drawings, wherein:

FIG. 4 also illustrates the steps involved in reducing oversized dummy structures.

DETAILED DESCRIPTION OF THE INVENTION

Figure 1:
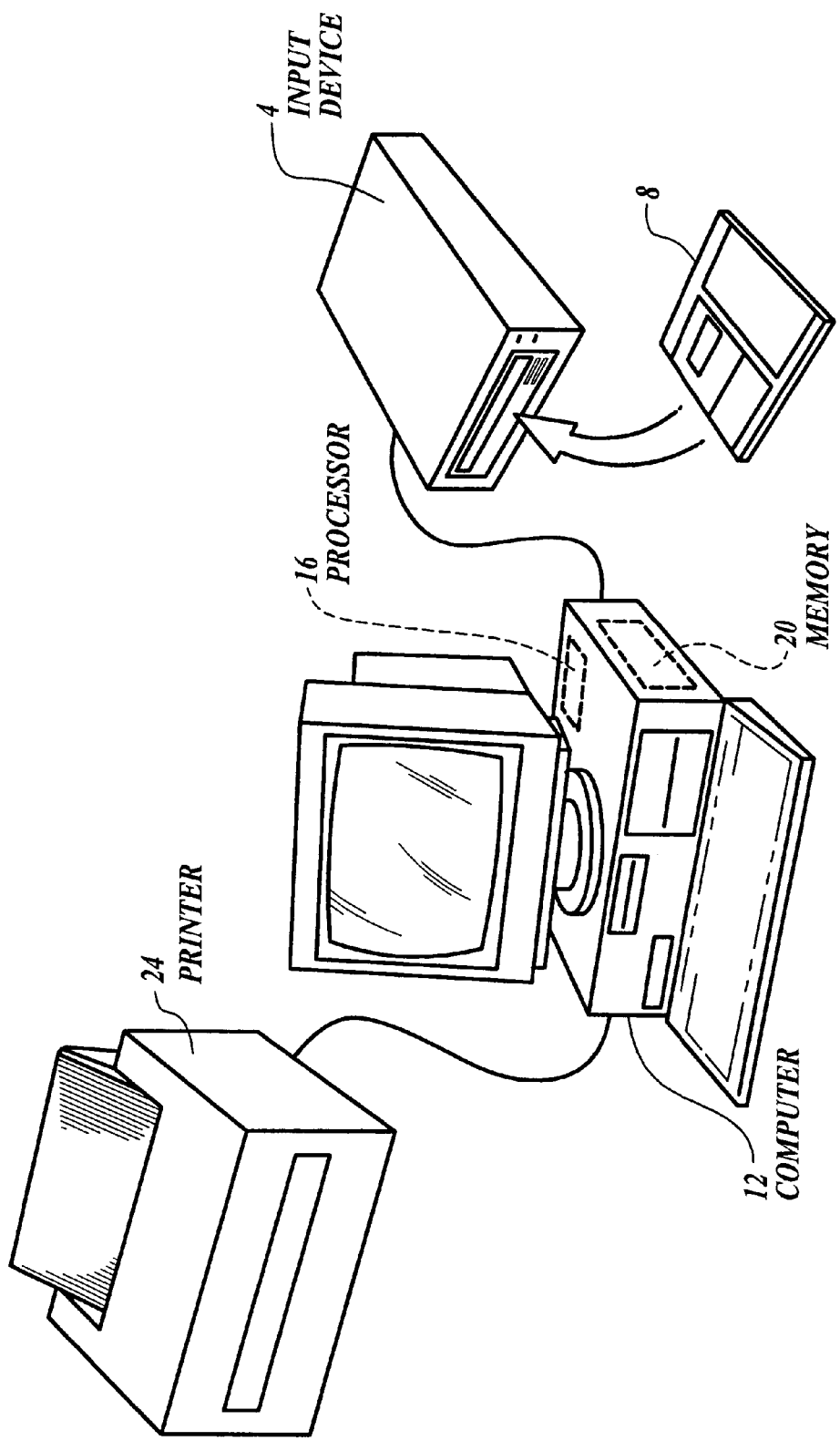
FIG. 1 illustrates a system for generating and merging dummy structures.

In the following discussion, certain conventions and definitions will be used to simplify the description and facilitate understanding of the invention. For example, much of the description will describe the merging or combining of dummy structures, however, it is to be understood that in most embodiments of the invention, the merging occurs mathematically on computer models of dummy structures rather than on a physical dummy structure. In one embodiment, such computer models define an outline of the boundaries of a dummy structure in a perimeter representation. Original artifacts in the semiconductor layer including parts of transistors, resistors, lines and other components are called "features". Often, these features result in a non-planer semiconductor layer FIG. 1 illustrates a system for generating and merging dummy structures. In the embodiment shown in FIG. 1, an input device 4 such as a disk driver receives a pattern of semiconductor features. Typically the pattern is input as an electronic graphic database file of layout shapes in an electronic form such as on a disk 8, a disk-based file server system, or electronic file server system suitable for processing by a computer 12. Computer 12 typically includes a processor 16 and a memory system 20. Mathematical data or models representing the pattern are stored in the memory system 20 which may include, random access memory, hard disk storage, or optical disk storage as well as other forms of data storage. Processor 16 executes a program residing in the computer 12 to process the mathematical models. In a complete process, the processor may (1) add dummy structure representations to the pattern, (2) merge multiple dummy patterns in a large open area into a single large dummy pattern and/or (3) eliminate oversized dummy patterns by replacing them with several smaller dummy patterns. Once the computer 12 has added and merged dummy structures, the computer 12 transmits the data to an output device 24 which may be a printer or other system for producing a second final dummy pattern including the semiconductor features and the final dummy structure pattern. The output device 24 will output the data in a format suitable for use in a masking machine or an electron beam (E-beam) machine. The E-beam machine generates a mask used in semiconductor processing, the mask typically includes semiconductor features and dummy structures. In the alternative, the output of computer 12 can be coupled directly to a mask making machine such as an E-beam machine to direct the output of a proper semiconductor mask.

Figure 2A:
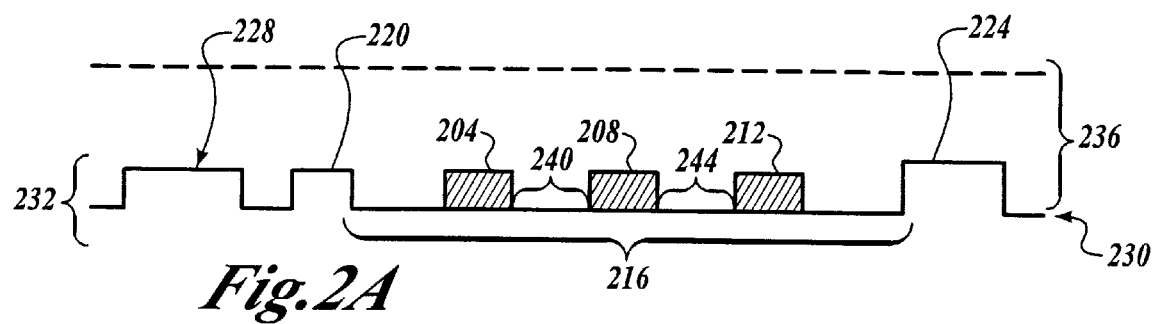
FIG. 2A illustrates a cross-sectional view of dummy structures in an area between semiconductor structures.

FIG. 2A illustrates a cross-sectional view of original dummy structures 204, 208 and 212 placed in an open field area 216 between circuit features 220 and 224. As noted, the circuit features 220, 224 and 228 rise above a base line 230 of semiconductor layer 232 to form artifacts in semiconductor layer 232. Insulation layer 236 is typically made of silicon dioxide material. The original dummy structures 204, 208 and 212 reduce or prevent depressions from forming or dishing of the insulation layer 236 deposited over the semiconductor layer 232. As can be seen from the illustration, original dummy structures 204, 208 and 212 are separated by small open areas or trenches 240 and 244, respectively. It is desirable to fill these small open areas with dummy structure material to form a single large merged dummy structure.

Figure 2B:
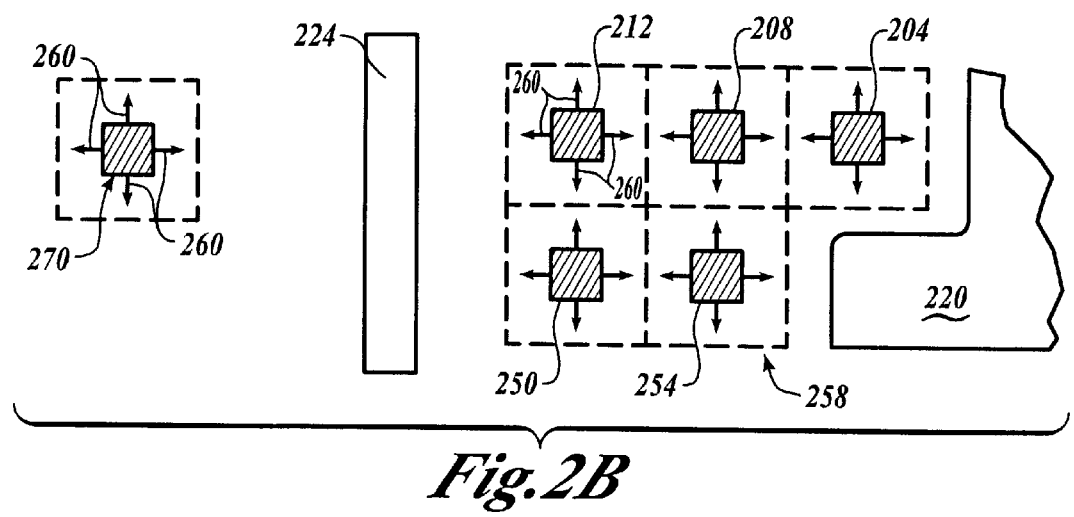
FIG. 2B illustrates a top view of dummy structures in the area between semiconductor structures.

FIG. 2B shows a top view of one possible configuration of features and dummy structures illustrated in FIG. 2A. Adjacent original dummy structures are dummy structures separated only by a single small open area or trench. For example, original dummy structures 204 and 212 are adjacent to original dummy structure 208. Original dummy structures 250 and 254 are adjacent to original dummy structures 212 and 208, respectively. In the illustrated embodiment, the original dummy structures shown are chosen to be square in size. Although this is a preferred embodiment of the invention, other geometric shapes for dummy structures are possible. Examples of other geometric shapes include, but are not limited or restricted to donut shapes and triangles. Typically, the square original dummy structures shown 204, 208, 212, 250 and 254 are approximately 4 microns by 4 microns on each side. However, these dimensions may change with changes in device processes and changes in feature geometries.

Figure 2C:
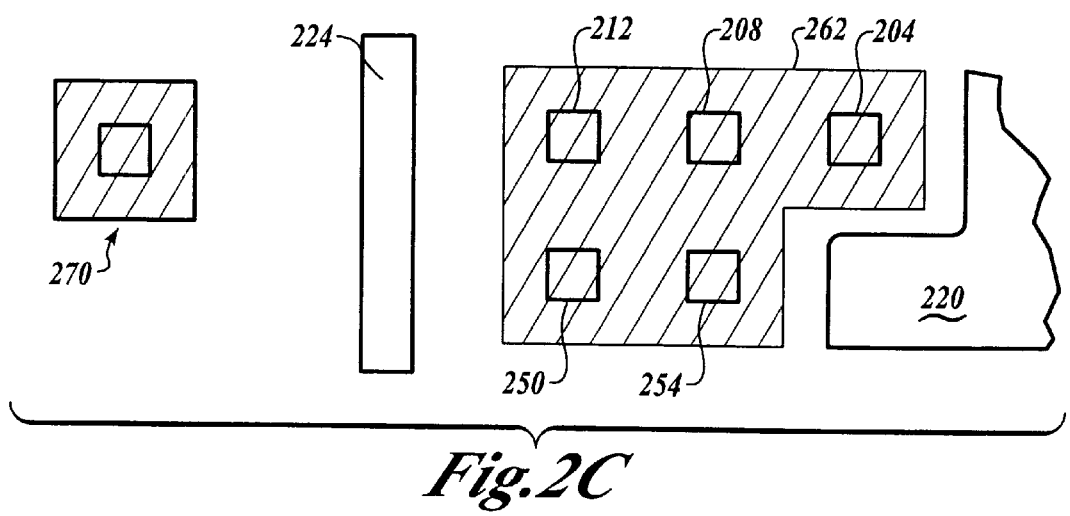
FIG. 2C illustrates a top view of an intermediate merged dummy structure.

Referring still to FIG. 2B, the dotted lines 258 represent expansion of a perimeter representation (typically a mathematical model) of the original dummy structures 204, 208, 212, 250 and 254. In the illustration, the original dummy structures which are square in shape are each expanded in a lateral direction along arrows 260 by a distance 0.5X where "X" is the width of trench 240 or the distance between adjacent square original dummy structures. In the described expansion, adjacent original dummy structures merge together. The dotted line 258 illustrates the resulting intermediate merged dummy structure. The merging in this case results from expanding each perimeter representation of each original square dummy structure 204, 208, 212, 250 and 254 by a distance 0.5X such that adjacent original square dummy structures e.g., 208 and 212 touch and are contiguous. When square type dummy structures are used as illustrated, the expansion of each original dummy structure perimeter is preferably 50% of the distance X between adjacent original dummy structures. In other dummy structure geometries, for example if the original dummy structures were circles, the expansion would typically be greater than 50% of the spacing between adjacent dummy structures to merge the original dummy structures. Merging the original dummy structures results in an intermediate merged-dummy structure 262 as illustrated in FIG. 2C. To facilitate understanding, original square dummy structures 204, 208, 216, 250 and 254 are also outlined in FIG. 2C.

In one embodiment, the ideal spacing between a dummy structure and a device feature is selected as distance "Y", and the spacing between adjacent original dummy structures "X". The distance X and Y may vary depending on processing technology. However, after expansion of the original dummy structures 212, 204, 208, 250 and 254 to generate an intermediate merged dummy structure 262, a distance less than Y separates the intermediate merged dummy structure 262 from an adjacent feature 220. In order to return the spacing between the perimeter of the intermediate merged dummy structure 262 from an adjacent feature 220 to a distance Y, the perimeter of the intermediate merged dummy structure must be a reduced by a distance 0.5X as illustrated by arrows 259 as shown in FIG. 2D.

Figure 2D:
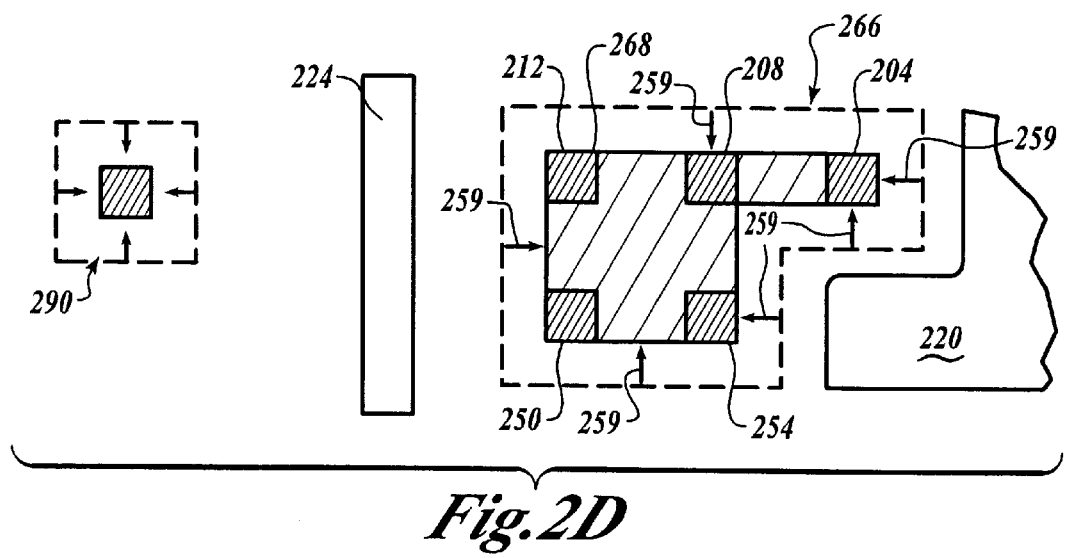
FIG. 2D illustrates a top view of a final merged dummy structure.

FIG. 2D shows the perimeter of the former intermediate merged dummy structure 262 as a dotted line 266. The shadow of the original dummy structures 212, 208, 204, 250 and 254 are also illustrated in dark shading. The final merged dummy structure 268 is spaced from the features 224 and 220 by distance Y.

It is recognized that when a solitary dummy structure has no adjacent dummy structures, then the solitary dummy structure after being expanded by distance 0.5X and reduced by distance 0.5X results in a final merged dummy structure identical to the original solitary dummy structure. Thus, the solitary dummy structure 270 of FIG. 2B expands to a lone intermediate merged dummy structure 280 of FIG. 2C and then is reduced to the final merged dummy structure 290 of FIG. 2D. The geometry and size of the final merged dummy structure 290 is identical to the original solitary dummy structure 270. In general the final merged dummy structure typically conforms to the open area that the final merged dummy structure was designed to fill, thus the final merged dummy structure may have an arbitrary shape.

Unfortunately, the generation of large final merged dummy structures that conform to the size of an open area creates a secondary problem. In particular, some of the final merged dummy structures may be too large or oversized. An oversized dummy structure creates too high a density of structure underneath the insulating layer 236 resulting in secondary planarization problems. Consequently, it is desirable to break up oversized dummy structures and replace them with several smaller dummy structures. In the preferred method for merging dummy structures, oversized dummy structures are reduced by replacing the oversized dummy structures with the original individual dummy structures before they were merged to form the oversized dummy structure.

Figure 3:
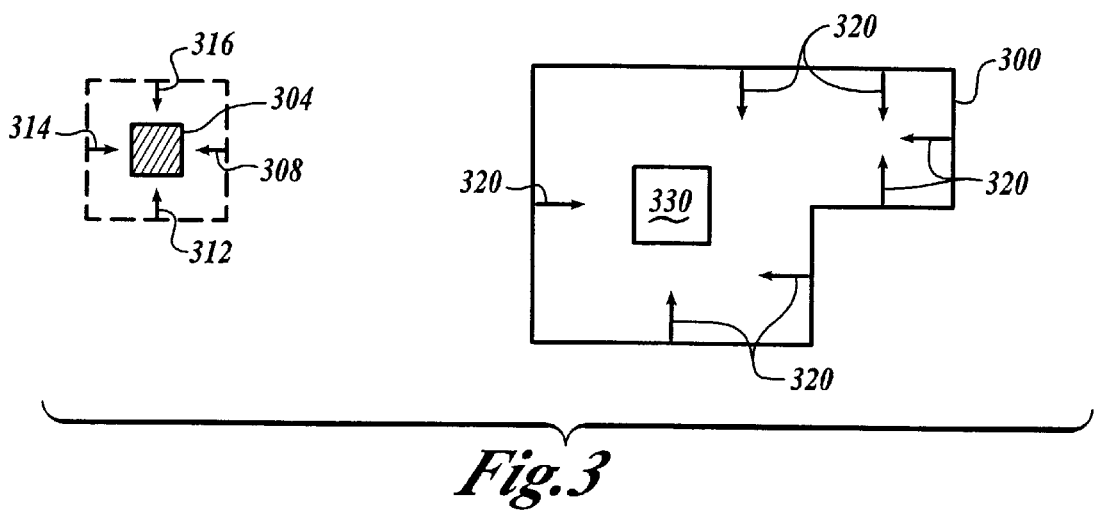
FIG. 3 illustrates a residual dummy structure.

FIG. 3 is a top view illustrating an oversized dummy structure 300. A solitary dummy structure 304 is also illustrated. In the illustrated embodiment, dummy structures beyond a size which results in planarization problems in subsequent layers are defined as oversized dummy structures. For example, in the illustrated embodiment, dummy structures which have a length and a width which exceeds a predetermined dimension "K" are oversized and appropriately altered. In the first step in a series of steps to detect oversized dummy structures, each side of a perimeter representation of a dummy structure is moved "inward" by a predetermined distance 0.5K in a contracting process as shown in FIG. 3. Thus, box 304 which is a single dummy structure with dimensions less than K×K is totally eliminated when each side of the box 304 is moved inwards in a lateral direction by distance 0.5K. In a square moving each side of a perimeter inward by distance 0.5K is equivalent to reducing the width and length of the square by dimension "K". The reduction in perimeter is shown by the arrows 308, 312, 314 and 316. Assuming that final dummy structure 300 is larger than the maximum allowable size of K×K and is of arbitrary shape, the arrows 320 illustrate the movement of each perimeter side reducing the perimeter representation of the oversized dummy structure 300 to a remainder structure 330. By reducing each dummy structure side by length K and by width K (equivalent to moving each side inward by 0.5K), smaller dummy structures disappear, thus, the existence of the remainder structure 330 identifies corresponding dummy structure 300 as an oversized dummy structure that must be divided.

Various methods may be used to divide an oversized dummy structure. In one method, the remainder structure 330 is expanded by dimension 0.5K to retrieve oversized portions of the original dummy structure 300. The oversized portions of the original dummy structure 300 is replaced with the original individual dummy structures which were merged to form the oversized dummy structure.

The previously outlined merge which combines small dummy structures and the steps which eliminates oversized dummy structures, helps maintain an approximately constant density of artifacts (dummy structures and features) across an entire planar surface. Thus, the density of dummy structures and features will be kept to between 40% and 80% across an entire planar surface.

The illustrative embodiments of FIGS. 2A, 2B, 2C, 2D and FIG. 3 illustrate an actual physical dummy structure. However, before the dummy structures are actually formed, each dummy structure is modeled as a perimeter representation in a machine. As discussed earlier, the machine is typically a computer and the perimeter representation of the dummy structure is a mathematical model from which the boundaries of a dummy structure can be determined. The location of the dummy structures as well as features of the semiconductor device may also be modeled in the machine representation. In one embodiment, the machine is a work station or personal computer which receives an input enabling the machine to reconstruct the semiconductor features. The machine is typically a computer which generates mathematical models of dummy structures and adds the dummy structures to open fields between semiconductor features in a pattern. The computer may further alter the mathematical model of dummy structures to merge or reduce the dummy structures.

Figure 4:
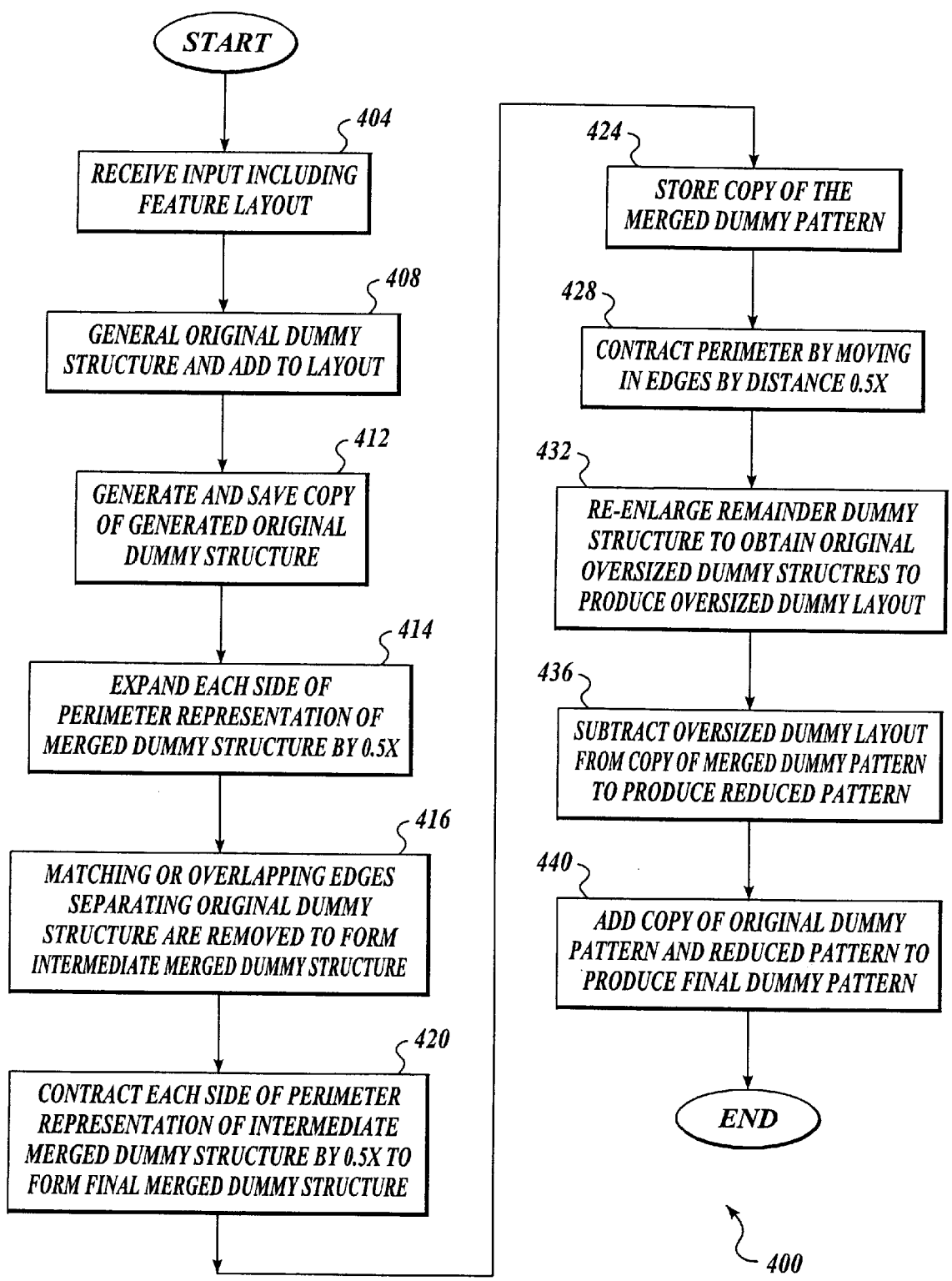
FIG. 4 is a flow diagram illustrating the merging process.

FIG. 4 shows a flow chart illustrating one method of implementing the steps taken by the machine, typically a processor, to calculate a layout of dummy structures or a "dummification layout". In step 404, the processor receives data indicating the location of the semiconductor features. Typically, the data is input in graphical form. One example of a typical input is a computer illustration mapping feature locations. In step 408, the processor adds a pattern of original dummy structures to the input. Each original dummy structures is modeled by a perimeter representation of the dummy structure. In one embodiment, each original dummy structure is a four micron by four micron square dummy structure. The small size allows each original dummy structure to be inserted into small areas between features.

A copy of the pattern containing the original dummy structures is generated and saved in step 412. This copy will later be used to replace oversized dummy structures with original dummy structures.

In step 414–420, the pattern containing the original dummy structures is subject to merging of the original dummy structures. In step 414, the perimeter representations of each original dummy structure is expanded by a distance 0.5X. The expansion is typically accomplished by moving each side of the original dummy structure in a lateral direction by distance 0.5X. A lateral direction is a direction perpendicular to the orientation of the side as indicated by arrow 260 in FIG. 2B. In a preferred embodiment, the dummy structures are square dummy structures and X is the distance between adjacent dummy structures. Thus, after the expansion of the perimeter representations of each original dummy structure, the perimeters of adjacent dummy structures are in close or substantial proximity to each other (touching or overlapping). In step 416, touching or overlapping edges of the dummy structure perimeter representation are removed to generate an intermediate merged dummy structure. "Intermediate merged dummy structures" include single dummy structures which did not actually merge with another dummy structure but were expanded by distance 0.5X.

After the 0.5X expansion, the spacings between the intermediate merged dummy structure and the surrounding features is separated by a distance less than Y. In step 420, the intermediate merged dummy structure is contracted or reduced to a proper size by moving each edge of the perimeter representation of the intermediate merged dummy structure inwards towards a center by distance 0.5X resulting in a final merged dummy structure. The final merged dummy structure is preferably separated from surrounding features by a distance of approximately Y. The shape of the final merged dummy structures approximately conforms to the open space it was designed to fill.

After the merging process, oversized merged dummy structures may result. Oversized merged dummy structures create unusually large areas of solid dummy structure unsuitable for planarization. Thus steps 424–448 in flow chart 400 replace these oversized dummy structures with several smaller dummy structures.

In step 424, a copy of the merged dummy pattern is stored. Merged dummy structures include all dummy structures that went through the merging process of steps 414–420. Hence, solitary dummy structures which have no adjacent dummy structures and were not actually merged with an adjacent dummy structure are still considered merged dummy structures. In step 428, each perimeter representation of each dummy structure is moved inward by distance 0.5K wherein "K" is the maximum allowable size of a dummy structure. Thus, a square perimeter representation of a dummy structure would have each side reduced by length K. Square dummy structures which have a length or width less than dimension K would completely disappear after the reduction step. After the reduction, overall dummy structures which have a dimension exceeding length K would leave remaining representations of dummy structures or remainder dummy structures. Remainder dummy structures result only when the dummy structures producing the remainder dummy structure had a length and width greater than length K. Thus, it is desirable to break up the oversized dummy structures that produced the remainder dummy structure.

Steps 432 through 440 provide a preferred embodiment of "breaking up" or replacing the oversized dummy structure. In steps 432, the processor re-enlarges the remainder dummy structures generated in step 428 by dimension "K" to produce an oversized dummy layout containing only oversized dummy structures. In step 436, the oversized dummy layout is subtracted from the copy of the merged dummy pattern from step 424 to generate a reduced pattern containing only merged dummy structures that are not oversized. Thus, all oversized dummy patterns have been removed from the reduced merged dummy pattern.

A final dummy pattern is generated by adding a copy of the original dummy pattern stored in step 412 to the reduced merged dummy pattern in step 440. In the subtracting and subsequent adding operations, oversized dummy structures are replaced with original dummy structures which were merged to form the oversized dummy structures. It is noted that the addition operation results in some dummy structures being represented twice in a database identifying dummy structures, (original dummy structure superimposed on top of merged dummy structures which are not oversized). These overlaps may be removed or in some cases the original dummy patterns surrounded by merged dummy patterns result in only the merged dummy pattern.

It is recognized that the above procedures may be varied by one of skill in the art to achieve the results in many different ways. For example, instead of executing steps 432–440, other methods of identifying oversized dummy structure may be used. Once identified the oversized dummy structures may be subdivided or replaced with smaller dummy structures. In one variation, instead of adding the original dummy pattern to the reduced pattern, the steps used to generate and add new original dummy patterns is executed on the reduced pattern treating the merged dummy structures as features. Such variations on the described merge and reduction procedures may be used to obtain a pattern which maintains an approximately 40 to 80% density of dummy structures and features across most of a substrate surface.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method of merging dummy structure representations comprising the step of:

expanding each side of a first dummy structure representation by a predetermined distance in a lateral direction such that the first dummy structure representation merges with an adjacent second dummy structure representation to form an intermediate merged dummy structure representation.

2. The method of claim 1 further comprising the step of:

expanding in a lateral direction each side of the adjacent second dummy structure representation to assist merging of the first dummy structure representation with the second dummy structure representation.

3. The method of claim 2 wherein each representation models an approximately square dummy structure.

4. The method of claim 2 wherein each side of said second dummy structure representation is also expanded in a lateral direction by the predetermined distance.

5. The method of claim 1 further comprising the step of:

expanding in a lateral direction each side of a third dummy structure representation such that the third dummy structure representation merges into the intermediate merged dummy structure representation.

6. The method of claim 1 further comprising the step of:

reducing in a lateral direction the intermediate merged dummy structure representation such that each side of the intermediate merged dummy structure representation is reduced by the predetermined distance to form a final merged dummy structure representation.

7. The method of claim 6 further comprising the step of:

replacing the final merged dummy structure representation with the first dummy structure representation and the second dummy structure representation when the final merged dummy structure exceeds a predetermined size.

8. The method of claim 1 wherein the first dummy structure representation represents a square dummy structure, and wherein the expanding step results in an increase in length of each side of the square dummy structure by the predetermined distance where twice the predetermined distance is the spacing between the first dummy structure and the second dummy structure.

9. A machine implemented method of removing oversized dummy structure representations comprising the steps of:

(a) determining a largest size dummy structure which can be accommodated by processing techniques, the largest size dummy structure having a maximum predetermined dimension; and (b) contracting a perimeter representation of a dummy structure by moving each side of the perimeter representation inward by half of the maximum predetermined dimension to form a representation of a remainder structure.

10. The machine implemented method of claim 9 further comprising the step of:

eliminating the dummy structure from a pattern layout when at least one of said each side of said perimeter representation has a length greater than or equal to the maximum predetermined dimension.

11. The method of claim 9 further comprising the steps of:

expanding the representation of the remainder structure by moving each side of the representation of the remainder structure outward by half of the maximum predetermined dimension.

12. The method of claim 9 wherein the perimeter representation of said dummy structure is generated by merging a plurality of original dummy structure representations.

13. The method of claim 9 further comprising the step of:

(c) repeating step (b) on a plurality of dummy structure representations in a pattern.

14. The method of claim 12 further comprising the step of:
replacing the dummy structure representation with a representation of a plurality of original dummy structures.

15. A processing system for producing a data file comprising:
a receiving unit to receive a data file;
a processing unit to add individual dummy structures to the data file, to subsequently merge the individual dummy structures and to generate a resulting merged data file; and
an output unit to output the resulting data file for use by a mask making machine.

16. The processing system of claim 15 wherein the processing unit merges the individual dummy structures by expanding the representation of each individual dummy structure to form a plurality of merged dummy structures.

17. The processing system of claim 16 wherein said processing unit eliminates oversized merged dummy structure.

18. The processing system of claims 15 wherein the resulting data file is suitable for input into an electron beam machine.

19. The processing system of claim 15 wherein the data file is a graphics data file.

20. A processing system for producing a data file comprising:
means for receiving a data file;
means for adding representations of individual dummy structures to the data file; and
means for merging the representations of individual dummy structures.

21. The processing system of claim 20 further comprising:
means for eliminating oversized dummy structures resulting from the merging.

22. A dummy pattern for use by semiconductor processing apparatus, the layout comprising:
a representation of semiconductor features;
a representation of a first dummy structure, the first dummy structure having a first length and a first width; and
a representation of a second dummy structure, said second dummy structure having a second length and a second width, said second length different from said first length and said second width different from said first width.

23. The dummy pattern of claim 22 wherein the area of the first dummy structure is smaller than the area of second dummy structure, the first dummy structure positioned in a very low density wide open region of semiconductor features while the second dummy structure is positioned in a medium/low density region with scattered semiconductor features.

24. A dummy pattern for use by semiconductor processing apparatus, the layout comprising:
a plurality of smaller dummy structures in open areas between semiconductor features in which the smallest dimension of the open area exceeds a predetermined dimension; and
at least one larger dummy structure in a medium/low density area in which the smallest dimension of an area between adjacent semiconductor features is smaller than the predetermined dimension.

25. The dummy pattern of claim 24 wherein the predetermined dimension is approximately 10–30 microns.

26. A method of preparing dummy structure representations comprising the steps of:
expanding each side of a first dummy structure representation by a predetermined distance in a lateral direction such that the first dummy structure representation merges with an adjacent second dummy structure representation to form an intermediate merged dummy structure representation;
determining a largest size dummy structure which can be accommodated by processing techniques, the largest size dummy structure having a maximum predetermined dimension;
contracting the intermediate merged dummy structure representation by moving each side of the intermediate merged dummy structure representation inward by half of the maximum predetermined dimension to form a representation of a remainder structure;
expanding the representation of a remainder structure by moving each side of the representation of the remainder structure outward by half of the maximum predetermined dimension to form an expanded remainder structure; and
replacing the expanded remainder structure with a representation of a plurality of smaller dummy structures.

* * * * *